United States Patent [19]

Pace

[11] 4,281,317
[45] Jul. 28, 1981

[54] MASKED HYSTERESIS IN DUAL-SLOPE ANALOG-TO-DIGITAL CONVERTER

[75] Inventor: W. David Pace, Tempe, Ariz.
[73] Assignee: Motorola, Inc., Schaumburg, Ill.
[21] Appl. No.: 31,554
[22] Filed: Apr. 19, 1979
[51] Int. Cl.³ .......................................... H03K 13/20
[52] U.S. Cl. ........................ 340/347 NT; 307/350; 328/146; 340/347 AD; 340/347 M; 340/347 CC
[58] Field of Search .... 340/347 M, 347 NT, 347 AD, 340/347 CC; 324/99 D; 307/350, 354, 362; 328/146

[56] References Cited
U.S. PATENT DOCUMENTS 3,942,173  3/1976  Wold ...................... 340/347 AD X Primary Examiner—Thomas J. Sloyan
Attorney, Agent, or Firm—Vincent B. Ingrassia

[57] ABSTRACT

In a dual-slope A/D converter employing hysteresis, a reference voltage circuit sets the threshold of the comparator at three distinct levels in response to a ramp control signal and the comparator output. As a reference capacitor ramps through a threshold voltage, the comparator output shifts the threshold with positive feedback (hysteresis) to provide noise immunity. The ramp control signal then shifts the threshold back to its original level cancelling the hysteresis provided at the first comparator trip point. Thus, the comparator switches at the same voltage for both slopes eliminating offset error.

11 Claims, 9 Drawing Figures

MASKED HYSTERESIS IN DUAL-SLOPE ANALOG-TO-DIGITAL CONVERTER

BACKGROUND OF THE INVENTION

1. Field of the Invention

This invention relates generally to analog-to-digital (A/D) conversion systems and, more particularly, to a dual-slope A/D converter employing masked hysteresis.

2. Description of the Prior Art

Analog-to-digital (A/D) converters have been widely used in the electronics field for converting analog voltages to digital representations suitable for use with random logic circuits and, more recently, with microprocessors. Furthermore, integrated circuit technology is finding many more applications in the field of engine control, particularly with regard to controlling automobile engines. Whereas digital circuitry is usually characterized by its "ONE/ZERO" or "ON/OFF" nature, most measurements in the real world are inherently analog; e.g., temperature, pressure, speed, voltage, etc. Thus, A/D conversion is essential to permit digital processing of the analog signals.

When an analog signal crosses certain transition points, the digital output signal provided by the A/D converter is caused to change state. When the signal is in the vicinity of one of these transition voltages, noise may cause the voltage of the analog input signal to vary above and below the transition voltage causing the digital output to rapidly switch between the two states. This is especially true in an automotive environment where large voltage transients having magnitudes which vary from 100 to 200 volts are not uncommon.

One technique for reducing unwanted switching of the digital output due to noise is to add hysteresis to the switching circuitry. The introduction of hysteresis in switching circuits for reducing the effect of noise signals and improving noise margin is well known in the art. For example, a regenerative comparator or Schmidt trigger is shown in Strauss, *Wave Generation and Shaping*, 1970 McGraw-Hill Book Company, pp. 445-447. Furthermore, the addition of hysteresis in a multiplexed A/D system is described in copending application Ser. No. 863,760 filed Dec. 23, 1977 and assigned to the assignee of the present invention. A disadvantage to this approach, however, resides in the fact that the use of hysteresis with the threshold comparator of a dual-slope A/D converter produce an offset error in the conversion.

SUMMARY OF THE INVENTION

It is an object of the present invention to provide an improved analog-to-digital converter circuit which reduces instability in the output signal due to noise.

It is a further object of the invention to provide an improved analog-to-digital converter circuit which adds hysteresis to a threshold detection comparator to improve noise immunity without a reduction in converter accuracy.

It is a still further object of the invention to provide an improved analog-to-digital converter circuit which adds hysteresis to a threshold detection comparator and then masks the hysteresis to eliminate offset voltage errors.

According to a broad aspect of the invention there is provided a dual-slope analog-to-digital (A/D) conversion system of the type wherein a comparator compares a voltage consisting of positive and negative sloped voltage ramps with a threshold voltage for generating digital output transitions at the crossover points thereof, said ramps being initiated by a ramp control signal, comprising: a threshold voltage generating circuit coupled to an input of said comparator; first means responsive to said ramp control signal and coupled to said input for altering said threshold voltage in a first direction and, subsequent thereto, in a second direction; and second means coupled to said input for altering said threshold voltage in said first direction and, subsequent thereto, in said second direction.

According to a further aspect of the invention there is provided a method for adding hysteresis to a threshold voltage of a dual-slope analog-to-digital (A/D) conversion system of the type wherein each slope of a dual-slope ramp signal is initiated by a bistable ramp control signal and wherein a comparator detects crossovers of said dual-slope ramp signal and said threshold voltage to generate a digital output signal, comprising: discharging a capacitor with an unknown current to produce a negatively sloped capacitor voltage when said ramp control signal is in a first state; detecting in said comparator the crossover of said negatively sloped capacitor voltage and said threshold voltage; increasing said threshold to provide hysteresis; and decreasing said threshold voltage to mask said hysteresis when said ramp control signal switches to a second state.

The above and other objects, features and advantages of the invention will be more clearly understood from the following detailed description taken in conjunction with the accompanying drawings, in which:

DESCRIPTION OF THE PREFERRED EMBODIMENT

Figure 1:
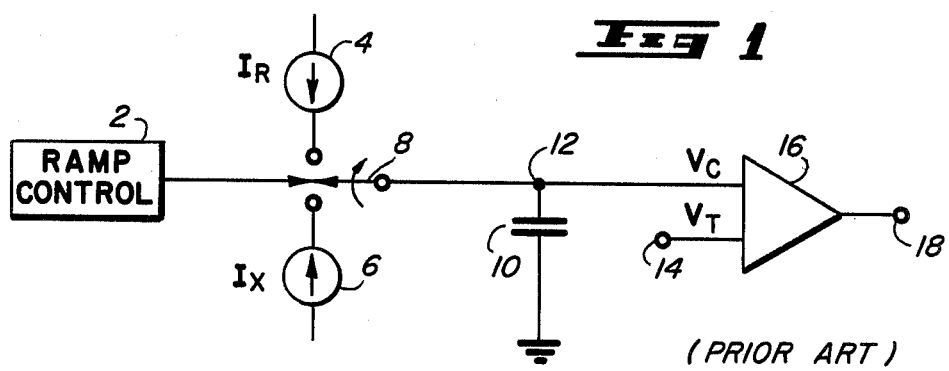
FIG. 1 is a functional diagram of an A/D converter employing hysteresis according to the prior art.
Figure 2A:
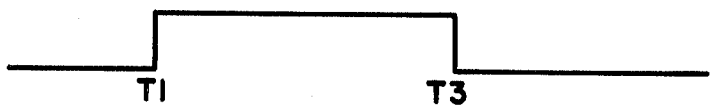
FIGS. 2a-2c are waveforms illustrating the operation of the apparatus shown in FIG. 1.
Figure 2B:
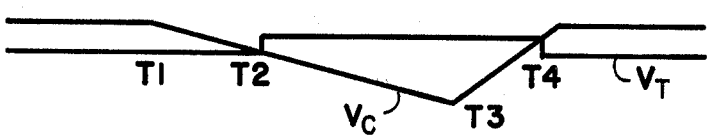

FIG. 1 illustrates, in functional form, an A/D converter employing hysteresis according to the prior art. A current source 4 supplies a reference current $I_r$ to a first terminal of switch 8, and a second current source 6 supplies a current $I_x$ proportional to an unknown input voltage to a second terminal of switch 8. A ramp control signal (FIG. 2a) controls the position of switch 8 such that when the ramp control signal is at a first level (high in FIG. 2a at time T1) current $I_x$ will be drawn from capacitor 10 thus reducing the capacitor voltage $V_c$ at node 12. When the ramp control signal is in a second state (low at T3 in FIG. 2a), switch 8 is positioned to permit current $I_r$ to flow through the switch thus increasing the voltage at node 12. A waveform illustrating the voltage at node 12 is shown in FIG. 2b as $V_c$. The downward slope represents a reduction in the voltage across capacitor 10 as a result of current $I_x$ being pulled away (interval T1-T3). The rising slope (T3-T4) represents an increase in the voltage across capacitor 10 due to the charging effect of current $I_r$.

Figure 2C:
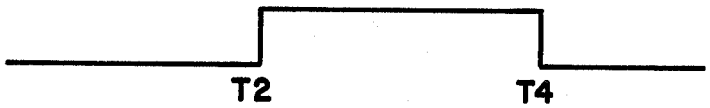

Also shown in FIG. 2b is a waveform illustrating the threshold voltage $V_T$ applied to terminal 14 of comparator 16. It can be seen that at time T2 a hysteresis voltage $V_H$ is added to the threshold voltage to achieve a clean output transition (T2 in FIG. 2c) at terminal 18. However, it can be seen that the next output transition (T4 in FIG. 2c) will occur at a threshold voltage which is greater than that of the previous transition by an amount equal to the hysteresis voltage $V_H$. If time T2–T3 is denoted t1 and time T3–T4 is denoted t2, then $$\frac{t2}{t1} = \frac{I_x}{I_r} + V_H\left(\frac{C}{t1\,I_r}\right)$$

where C is the capacitance of capacitor 10 and $$V_H\left(\frac{C}{t1\,I_r}\right)$$

is the offset error in the conversion of $I_x$ to t2.

Figure 3:
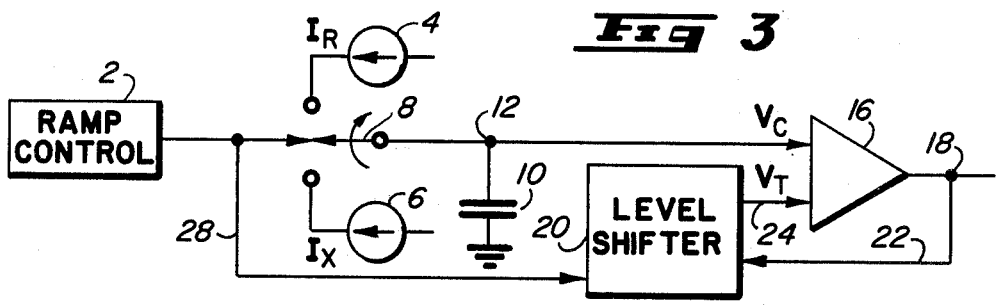
FIG. 3 is a functional diagram of an A/D converter according to the present invention.

The arrangement shown in FIG. 3 and discussed in more detail below utilizes the ramp control signal to mask the comparator hysteresis to produce a comparator output signal without a corresponding offset error. Referring to FIG. 3 and FIGS. 4a–4c, the ramp control generator 2 applies a ramp control signal (FIG. 4a) to switch 8. The ramp control signal has a positive transition at time T1 and a negative transition at time T3 and is applied to level shifter 20 over line 28. The output of comparator are likewise applied to level shifter 20 via line 22.

At the positive transition of the ramp control signal (T1 in FIG. 4a) the threshold voltage $V_T$ is increased to an intermediate value (T1 in FIG. 4b) by level shifter 20. As the capacitor voltage ramps through the threshold voltage $V_T$ (T2 in FIG. 4b) the comparator output shifts the threshold voltage in a manner comprising positive feedback (hysteresis) to provide the desired noise immunity and a clean transition of the comparator output (T2 in FIG. 4c. At the negative transition of the ramp control signal (T3 in FIG. 4a) switch 8 is positioned so as to apply the reference current $I_r$ to capacitor 10 to begin charging the capacitor (T3 in FIG. 4b). At the same time, the threshold voltage $V_T$ is reduced to the value it was just prior to the first comparator trip point thus cancelling the hysteresis shift. Thus, the second comparator trip point (during the positive slope of $V_c$) will occur at the same threshold voltage as the first comparator trip point (during the negative slope of $V_c$), and there exists a linear relationship between the input current $I_x$ and the output time T3–T4 without an offset error. That is:

$$\frac{t2}{t1} = \frac{I_x}{I_r}$$

It should be appreciated at this point that the ramp control signal is an input to the inventive A/D converter, and the generation thereof is not considered a part of the present invention. The ramp control signal may be produced by a microprocessor or other appropriate circuitry well known to those skilled in the art.

Figure 5:
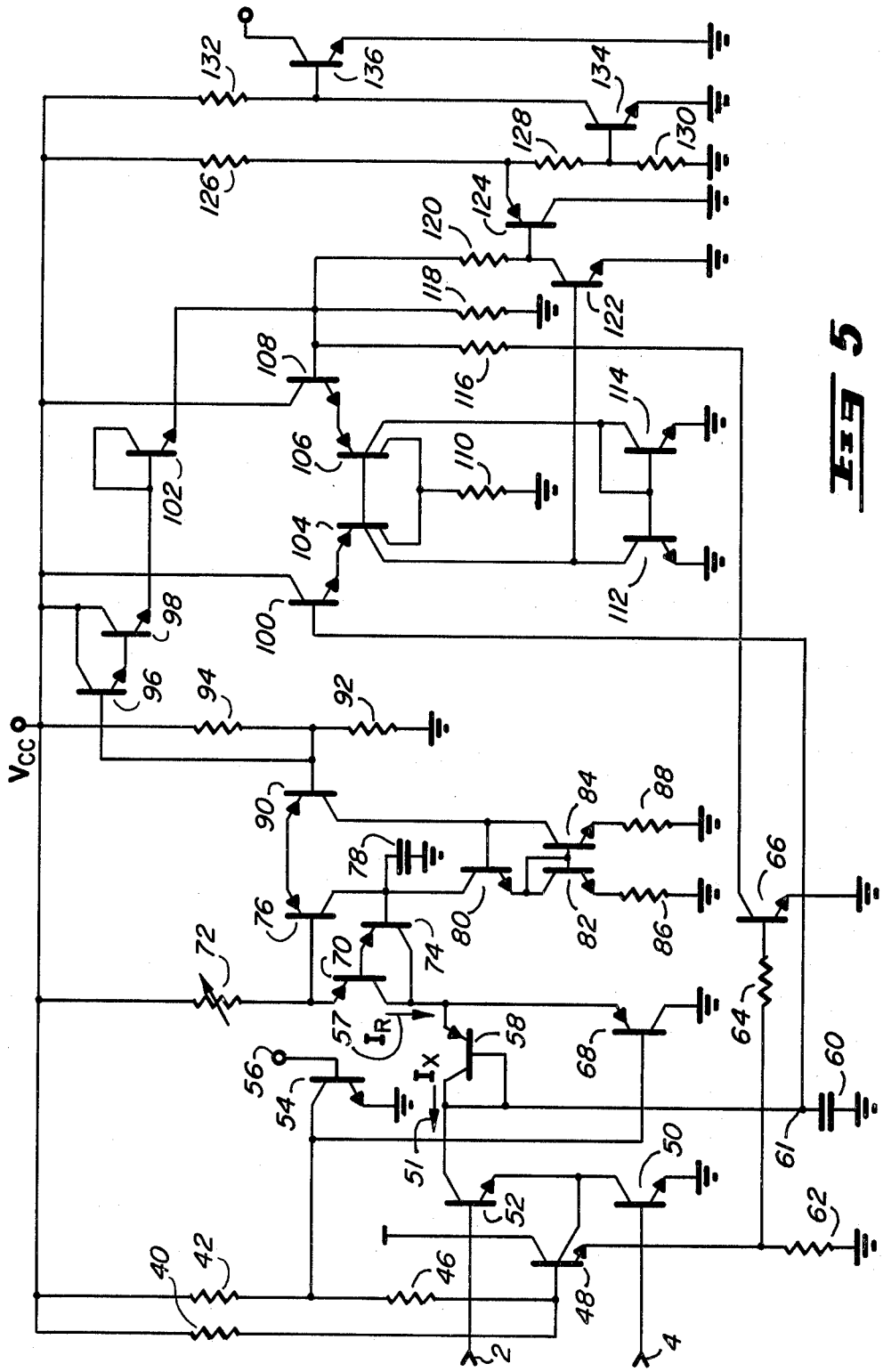
FIG. 5 is a detailed schematic diagram of the inventive A/D converter.

FIG. 5 is a detailed schematic diagram of the apparatus shown in FIG. 3. A first amplifier comprises transistors 70, 74, 76, 80, 82, 84 and 90, resistors 86 and 88, and capacitor 78. Transistors 76 and 90 are coupled in a common emitter configuration. The collector of transistor 90 is coupled to the base of transistor 80 and to the collector of transistor 84. The collector of transistor 76 is coupled through capacitor 78 to ground and to the collector of transistor 82 via the collector-emitter path of transistor 80. The base of transistor 82 is coupled to its collector, and the emitters of transistors 82 and 84 are coupled to ground via resistors 86 and 88 respectively. Transistor 74 has a base coupled to the junction of the collectors of transistors 76 and 80, has a collector coupled to the collector of transistor 70 and an emitter coupled to the base of transistor 70. The emitter of transistor 70 is coupled to the base of transistor 76 and to the source of supply Vcc through variable resistor 72. The input of this amplifier (the base of transistor 90) is coupled to a voltage divider comprising resistors 92 and 94, which voltage divider is coupled to Vcc. Thus, a reference voltage $V_r$ is produced at the base of transistor 90 to produce a usable reference current $I_r$ indicated by arrow 57. The generation of the reference current $I_r$ is not considered a part of the instant invention, and since amplifiers of this type are known to those skilled in the art, further discussion is not deemed necessary. Under circumstances to be described below, the current $I_r$ will be applied to reference capacitor 60 via diode 58.

The generation of an input current $I_x$ proportional to an unknown input voltage is likewise not considered a part of this invention and may be accomplished by techniques well known to circuit designers as for example that used for the reference current previously discussed with a current mirror output. Transistors 50 and 52 form the second half of a current mirror which is coupled via lines 32 and 34 to the front end of a current mirror (not shown) through which the current $I_x$ is flowing thus producing the current $I_x$ (arrow 51) at the collector of transistor 52. Under circumstances also to be described below, the current $I_x$ is pulled from reference capacitor 60.

Figure 4A:
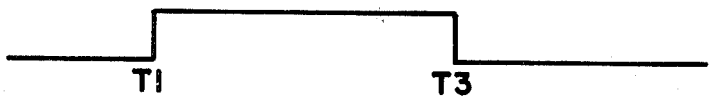
FIGS. 4a-4c are waveforms illustrating the operation of the apparatus shown in FIG. 3.
Figure 4B:
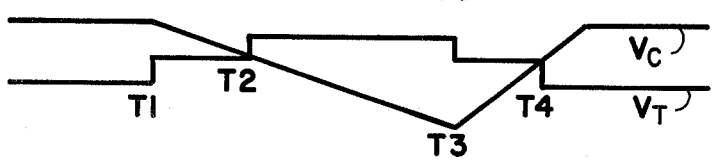
Figure 4C:
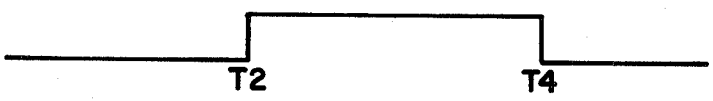

The ramp control signal (FIG. 4a) is applied to the base terminals of transistor 54 via terminal 56. At the positive transition of the ramp control signal (T1) transistor 54, having an emitter coupled to ground and a collector coupled to the base of transistor 68 and to the junction of resistors 42 and 46, turns on thus turning on transistor 68. In this case, reference current $I_r$ flows through transistor 68 to ground thus taking no part in increasing the capacitor voltage at node 61. At this time, the ramp control signal via transistor 54 and resistor 46 pulls the base drive away from transistor 48 turning it off. Thus, transistor 50 pulls $I_x$ from capacitor 60 through the collector emitter path of transistor 52. This causes the capacitor voltage at node 61 to ramp downward as shown in FIG. 4b.

When the ramp control signal goes down (T3 in FIG. 4a), transistor 54, and therefore transistor 68, are turned off and the reference current $I_r$ is applied to reference capacitor 60 via diode 58. Since base drive is again being supplied to transistor 48, transistor 50 pulls current $I_x$ via a first emitter of transistor 48. Transistor 52 no longer pulls $I_x$ and therefore the capacitor voltage at node 61 will begin to ramp upward as shown in FIG. 4b.

A second comparator comprises transistors 100, 104, 106, 108, 112 and 114 and resistor 110. The base of transistor 100 is coupled to the capacitor voltage $V_c$ at node 61, and the base of transistor 108 is coupled to the threshold voltage $V_T$. The collectors of transistors 100 and 108 are coupled to Vcc and their respective emitters are coupled to the emitters of transistors 104 and 106 respectively. The bases and a first collector of transistors 104 and 106 are coupled together and to ground via resistor 110. The second collector of transistors 104 and 106 are coupled to ground via the collector-emitter paths of transistors 112 and 114 respectively. The bases of transistors 112 and 114 are coupled together and to the collector of transistor 114.

The threshold level at the base of transistor 108 is set, at least in part, by the reference voltage at the base of transistor 90 dropped by 3 Vbe's in Darlington level shifters 96, 98 and 102. As will be described below, $V_T$ at the base of transistor 108 is varied by placing resistors 116 and 120 in and out of the circuit. As resistance is added, the current through the Darlington arrangement is increased thus increasing the base-to-emitter voltage drops in the Darlington transistors and reducing $V_T$ at the base of transistor 108.

In the steady state condition, the base of transistor 100 is at a higher voltage than that on the base of transistor 108. Thus, transistor 122 having a base coupled to collectors of transistors 112 and 104 is on causing current to flow through resistor 120 to ground via the collector-emitter path of transistor 122. Further, transistor 66 having a base coupled to a second emitter of transistor 48 via resistor 64 is on causing current to flow through resistor 116 to ground via the collector-emitter path of transistor 66.

When the ramp control signal at the base of transistor 54 goes high, transistor 48 turns off turning off transistor 66 thus causing resistor 116 to be dropped out of the circuit leaving only the parallel arrangement of resistors 118 and 120. Therefore, $V_T$ at the base of transistor 108 will rise as is shown at T1 in FIG. 4B. Since $I_x$ is now being pulled from the reference capacitor 60 as described above, the voltage at the base of transistor 100 begins to fall. When this voltage ($V_c$) reaches the voltage at the base of transistor 108 ($V_T$), transistors 108, 106, 114 and 112 turn on pulling current from the base of transistor 122 turning it off. Thus, resistor 120 is pulled out of the circuit and $V_T$ again rises as is shown at T2 in FIG. 4B. Substrate transistor 124 having a base coupled to the collector of transistor 122 turns off, and transistor 134 having a base coupled to the junction of series resistors 128 and 130 which in turn are coupled between ground and Vcc through resistor 126 turns on. In this manner, the output at the collector of transistor 136 goes high as is shown at T2 in FIG. 4C transistor 136 having a base coupled to the collector of transistor 134 and to Vcc via resistor 132 and having an emitter coupled to ground.

When the ramp control signal goes low (T3 in FIG. 4A), transistor 66 is again turned on once more allowing current to flow in resistor 116. Therefore, $V_T$ at the base of transistor 108 is decreased as is shown at T3 in FIG. 4B. Finally, when the upward slope of $V_c$ reaches $V_T$, the base voltage at transistor 100 again exceeds the base voltage of transistor 108. Transistor 122 is again turned on placing resistor 120 back in the circuit. Thus, $V_T$ again decreases as is shown at T4 in FIG. 4B. Transistor 124 again turns on, and transistor 134 turns off. This causes the output at the collector of transistor 136 to go low as is shown at T4 in FIG. 4C.

It should be appreciated that to optimize circuit operation, the increases in $V_T$ at T2 should equal the decrease at T3. This may be accomplished by choosing the values of resistors 116 and 120 to be equal.

The above described circuit adjusts the comparator threshold voltage in response to the ramp control and comparator output signal to produce and then mask the comparator hysteresis thus improving noise immunity without decreasing accuracy.

While the invention has been described with reference to a specific embodiment thereof, the above and other changes in form and details may be made therein without departing from the spirit and scope of the invention.

I claim:

1. In a dual-slope analog-to-digital (A/D) conversion system of the type wherein a comparator compares a ramp voltage consisting of first and second sloped voltage ramps with a threshold voltage for generating digital output transitions at the crossover points thereof, said ramps being initiated by a ramp control signal, a circuit for reducing offset error comprising:
   a threshold voltage generating circuit coupled to an input of said comparator;
   first means responsive to said ramp control signal and coupled to said input for altering said threshold voltage in a first direction upon a first transition of said ramp control signal and, subsequent thereto, in a second direction upon a second transition of said ramp control signal; and
   second means coupled to said input for again altering said threshold voltage in said first direction when said first ramp crosses said threshold voltage and, subsequent thereto, in said second direction when said second ramp crosses said threshold voltage.

2. A circuit according to claim 1 wherein said ramp control signal has first and second states and wherein said first means comprises first resistive means coupled to said input for increasing and for decreasing said threshold voltage.

3. An A/D conversion system according to claim 2 wherein said second means comprises second resistive means coupled to said input for altering said threshold voltage in said first direction at a first one of said crossover points and in a second direction at a second adjacent crossover point.

4. A circuit according to claim 3 further including first switching means responsive to said ramp control signal for coupling said first resistive means to ground when said ramp control signal is in said second state.

5. A circuit according to claim 4 further including second switching means coupled to said comparator and responsive to an output thereof for coupling said second resistive means to ground at said second adjacent crossover point.

6. A circuit according to claim 5 wherein said first and second resistive means are resistors of equal value.

7. In a dual slope analog-to-digital (A/D) converter of the type wherein a capacitor is discharged by an unknown current and then charged with a reference current to produce a capacitor voltage in the form of a sloped first ramp followed by a oppositely sloped second ramp, said first and second ramps being initiated by changes in a ramp control signal from a first to a second state and from said second to said first state respectively, a circuit for reducing offset error comprising:
   a threshold voltage generating circuit;
   a comparator having an output, a first input coupled to said capacitor voltage and a second input coupled to said threshold voltage;
   first means coupled to said second input and responsive to said ramp control signal for increasing said threshold voltage upon a first transition of said ramp control signal and for decreasing said threshold voltage upon a second transition of said ramp control signal; and second means coupled to said second input and to said comparator output for further increasing said threshold voltage when said first ramp crosses said threshold voltage and for decreasing said threshold voltage when said second ramp crosses said threshold voltage.

8. A circuit according to claim 7 wherein said first and second means are first and second resistive means.

9. A circuit according to claim 8 further including first switching means responsive to said ramp control signal for coupling said first resistive means to ground when said ramp control signal is in said first state.

10. A circuit according to claim 9 further including second switching means coupled to said comparator output for coupling said second resistive means to ground when said second ramp crosses said threshold voltage.

11. A circuit according to claim 10 wherein said first and second resistive means are resistors of equal value.

* * * * *